United States Patent
Hendrix et al.

(10) Patent No.: US 8,047,383 B2
(45) Date of Patent: Nov. 1, 2011

(54) RACKMOUNT SYSTEM INCLUDING CONVERSION RAIL

(75) Inventors: Alvin F. Hendrix, Salida, CA (US); Daniel L. Rivard, San Jose, CA (US); Rick-Nghia T. Nguyen, San Jose, CA (US)

(73) Assignee: Foundry Networks, LLC, San Jose, CA (US)

( * ) Notice: Subject to any disclaimer, the term of this patent is extended or adjusted under 35 U.S.C. 154(b) by 1269 days.

(21) Appl. No.: 11/290,291

(22) Filed: Nov. 29, 2005

(65) Prior Publication Data
US 2007/0119792 A1    May 31, 2007

(51) Int. Cl.
*A47F 7/00*    (2006.01)
(52) U.S. Cl. ........................................................ 211/26
(58) Field of Classification Search .................... 211/26, 211/189; 361/683, 724–727, 687, 679; 312/223.1, 312/223.2
See application file for complete search history.

(56) References Cited

U.S. PATENT DOCUMENTS

| | | | | |
|---|---|---|---|---|
| 4,485,930 A * | 12/1984 | Savelkouls | ...................... | 211/74 |
| 4,592,601 A * | 6/1986 | Hlinsky et al. | ................ | 312/111 |
| 5,325,975 A * | 7/1994 | Brown et al. | .................. | 211/189 |
| 5,497,888 A * | 3/1996 | Michaels et al. | ................ | 211/10 |
| 6,336,691 B1 * | 1/2002 | Maroney et al. | .............. | 312/236 |
| 6,352,321 B1 * | 3/2002 | Munoz | ........................... | 312/119 |
| 6,364,140 B1 * | 4/2002 | Hayes | ........................... | 211/188 |
| 6,693,796 B2 * | 2/2004 | Ives et al. | ....................... | 361/685 |
| 6,785,459 B2 * | 8/2004 | Schmidt et al. | ............... | 385/134 |
| 6,833,995 B1 * | 12/2004 | Hsue et al. | ..................... | 361/727 |

* cited by examiner

*Primary Examiner* — Katherine Mitchell
*Assistant Examiner* — Candace L Bradford
(74) *Attorney, Agent, or Firm* — Bever, Hoffman & Harms, LLP; E. Eric Hoffman (57) ABSTRACT

A rackmount chassis includes removable supports that provide interior support for blades having mounting edge-to-mounting edge dimensions that are less than the full chassis width. The removable supports are mounted on parallel support plates that span the full width of the chassis. Each removable support supports an edge of at least one blade installed into the rackmount chassis. The locations of the removable supports on the parallel support plates determine the blade form factors (mounting edge-to-mounting edge dimensions) that the rackmount chassis can accept. Because the removable supports can be individually removed/installed, the configuration of the resulting rackmount component can be changed without physically removing the rackmount component from the rack in which it is mounted.

18 Claims, 9 Drawing Sheets

RACKMOUNT SYSTEM INCLUDING CONVERSION RAIL

BACKGROUND OF THE INVENTION

1. Field of the Invention

The invention relates to an electronics enclosure, and in particular, to a highly configurable rackmount chassis.

2. Related Art

Large electronic installations are often implemented using rackmount architecture to provide maximum space efficiency and large-scale modularity. Rackmount systems typically follow the Electronics Industry Alliance (EIA) standard EIA-310-D that specifies an overall rackmount system width of 19 inches. Rackmount components must therefore be designed to fit within the specified system limits.

Figure 1:
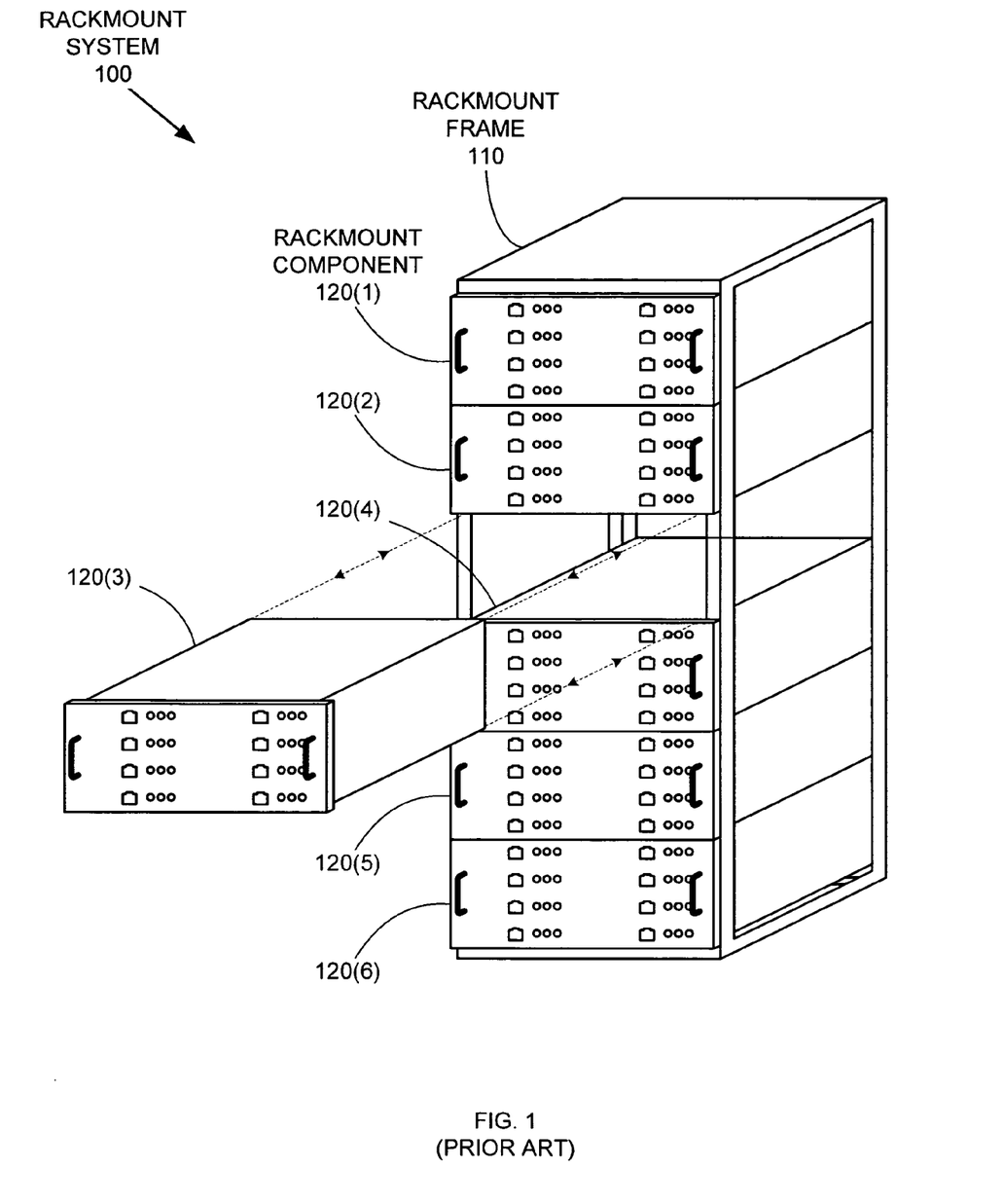
FIG. 1 is an isometric diagram of a typical rackmount system depicting the mounting of multiple rackmount components in a single rack.

FIG. 1 shows an exemplary rackmount system 100 that includes a rack 110 populated by rackmount components 120. Rack 110 is simply a metal framework that defines an installation space for rackmount components 120. Rackmount components 120 (e.g., servers, routers, switches, and other electronic devices) are installed into rack 110, thereby providing a modular, standardized electronics system installation.

Each rackmount component 120 is a self-contained unit for providing a desired functionality. Typically, a rackmount component will be formed from a rackmount chassis that houses one or more "blades" (i.e., processors, memory, and/or other elements mounted on a circuit board). For example, a rackmount router may include multiple Ethernet blades that route network traffic to and from a larger bandwidth trunk. The overall capabilities of a rackmount component therefore depend on the number and type of blades installed in that rackmount component. Accordingly, those capabilities are in large part determined by the blade-mounting capacity of the rackmount chassis of the rackmount component.

Figure 2A:
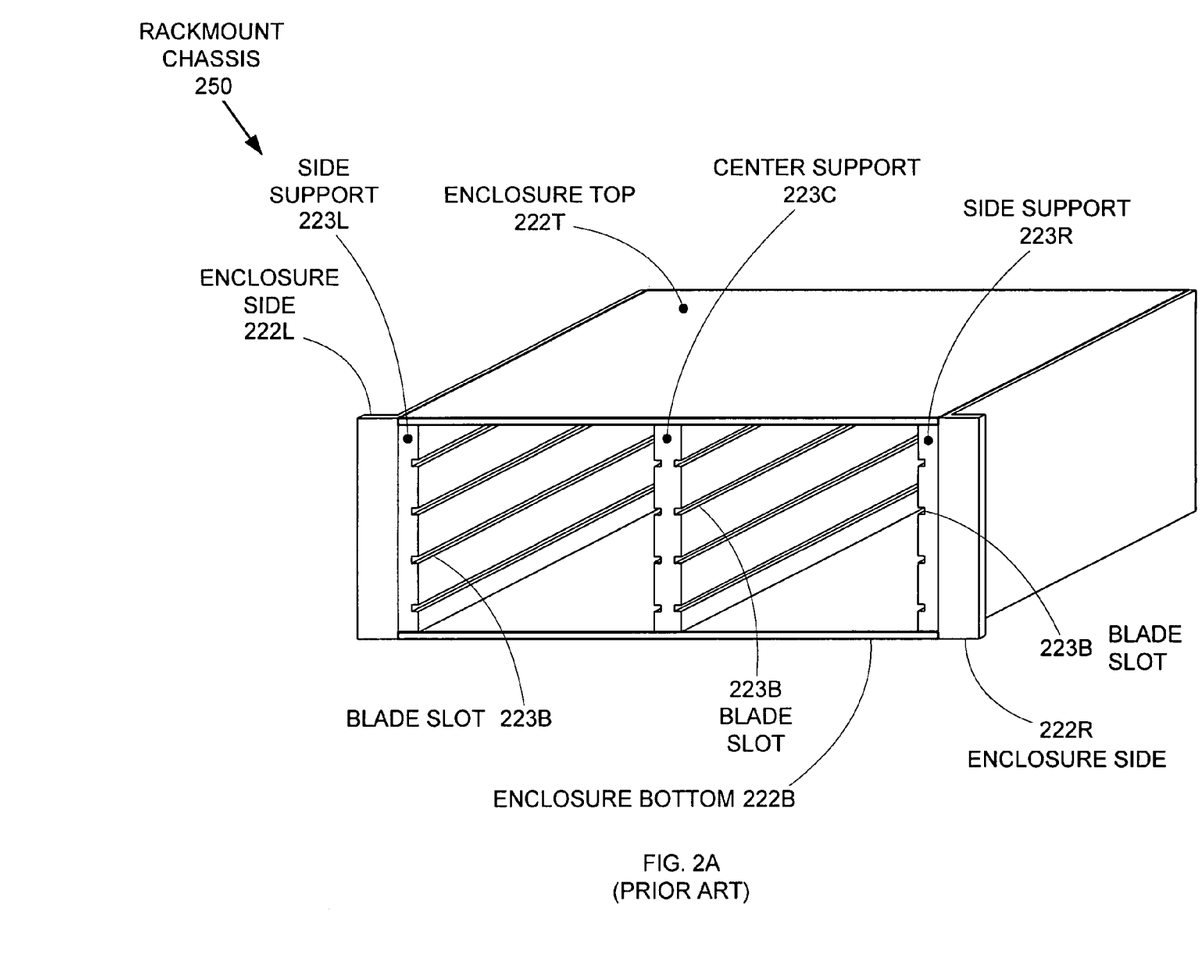
FIG. 2A is an isometric diagram of a conventional rackmount chassis.

FIG. 2A shows an isometric diagram of a conventional rackmount chassis 250. Rackmount chassis 250 includes an enclosure top 222T, an enclosure bottom 222B, and enclosure sides 222L and 222R that form a box-like enclosure. Side supports 223L and 223R are mounted within this box-like enclosure between enclosure top 222T and enclosure bottom 222B, and adjacent to enclosure side 222L and 222R, respectively. A center support 223C is mounted between enclosure top 222T and enclosure bottom 222B, midway between side support 223L and 223R.

To provide installation locations for blades within rackmount chassis 250, side supports 223L and 223R and center support 223C include multiple blade support slots 223B. Each blade support slot 223B in side supports 223L and 223R is positioned at the same level as a corresponding blade support slot 223B in center support 223C. Each of these pairs of blade support slots allows a blade to be installed into rackmount chassis 250.

Figure 2B:
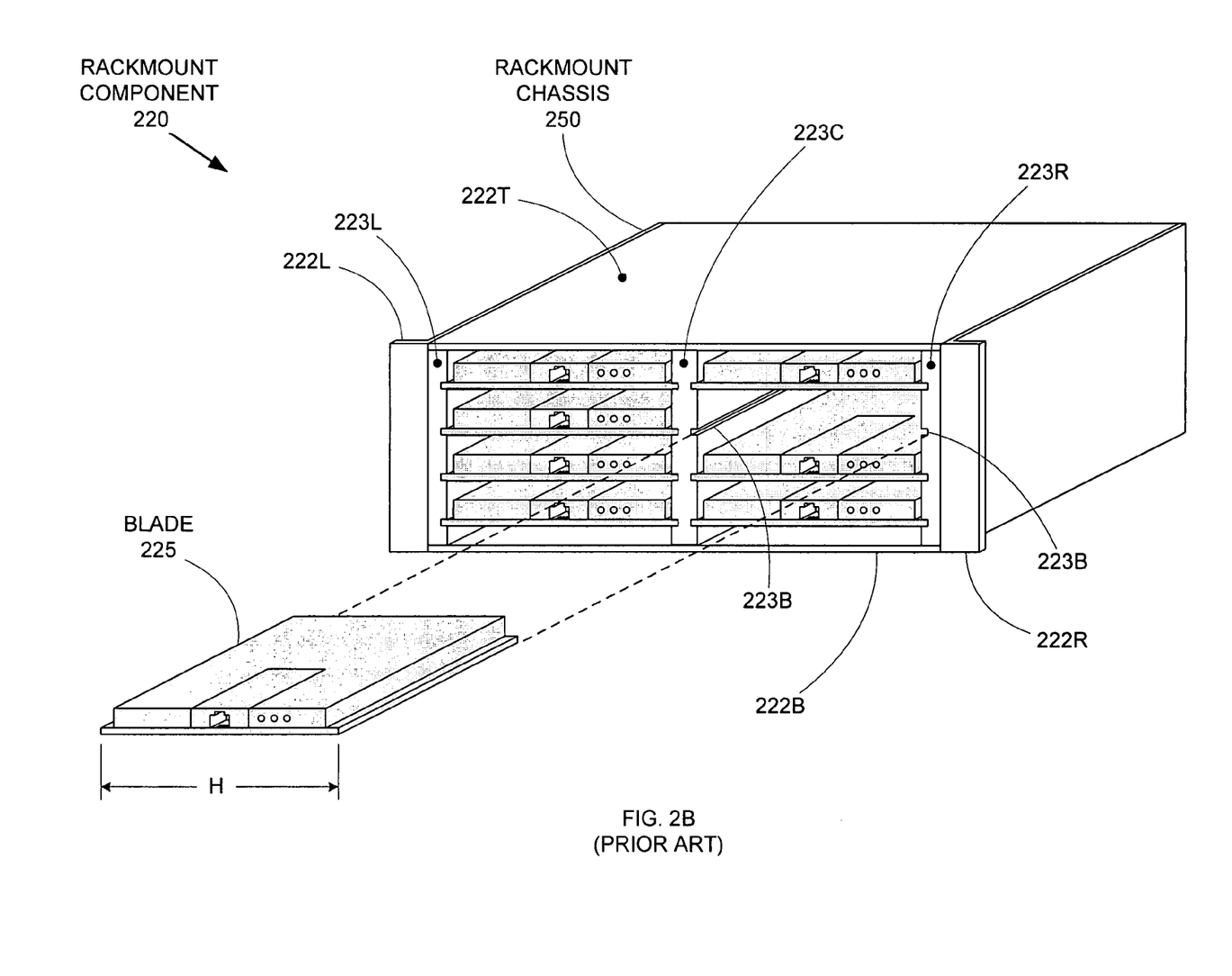
FIG. 2B is an isometric diagram of a conventional rackmount component incorporating the rackmount chassis of FIG. 2A.

For example, FIG. 2B shows an isometric diagram of a conventional rackmount component 220. Rackmount component 220 includes multiple blades 225 installed into rackmount chassis 250. The edges of each blade 225 slide in to one blade support slot 223B on one of side supports 223L and 223R, and the corresponding blade support slot 223B on center support 223C. In this manner, rackmount chassis 250 is populated with blades 225 to form a functional rackmount component 220.

Note that due to historical conventions, the side edge to side edge distance of a rackmount blade (i.e., the distance between the mounting edges of the blade, which are generally perpendicular to the electrical contact edge of the blade) is referred to as the "height" of the blade, even though the dimension is parallel to the width of the rackmount chassis. Thus, blades such as blades 225, which span roughly half the total width of rackmount component 220, are sometimes referred to as "half height" blades. Due to the construction of rackmount chassis 250 (i.e., a fixed center support 223C that runs between enclosure top 222T and enclosure bottom 222B), blades 225 must all exhibit the same height H. Therefore, replacing any of blades 225 with a larger or smaller blade is typically infeasible.

For example, blades 225 could all be fast Ethernet (i.e., 100 Mbps) network interface cards. Should increased network traffic handling capabilities be desired for rackmount component 220, it would be desirable to replace some or all of blades 225 with higher bandwidth gigabit Ethernet (i.e., 1 Gbps or 10 Gbps) or fiber optic network interface cards (blades). However, next generation technology is typically larger than existing generation technology. For example, if current fast Ethernet blades exhibit a half height form factor, next generation gigabit Ethernet blades may exhibit a full height form factor (i.e., a height that spans roughly the full width of the rackmount chassis). This blade size disparity would then preclude installation of the next generation technology into an existing rackmount component.

Consequently, to achieve the higher bandwidth benefits of the new blades, rackmount component 220 would be required to be uninstalled from its rack and be replaced with a different rackmount component having a rackmount chassis particularly configured to accept the newer blades. However, total rackmount component replacement of this sort is undesirable due to the overall system downtime and labor expense associated with such removal and reinstallation.

Accordingly, it is desirable to provide a rackmount chassis that can accommodate a range of blade widths.

SUMMARY OF THE INVENTION

Conventional rackmount chassis designs impose fixed size requirements on blades installed into those chassis designs. Specifically, once a conventional rackmount chassis is configured to accept blades of a particular height, reconfiguring that chassis to accept blades of a different height is not possible without removal of the entire chassis from the rackmount system in which it is mounted. By incorporating support plates that run the length of the chassis and removable support rails that are installed onto those supports spans, a rackmount chassis be provided that allows in-situ reconfiguration (i.e., reconfiguration without removal of the chassis from the rack in which is it installed) to accommodate blades of different heights.

In one embodiment, a rackmount chassis can include multiple parallel support plates mounted between two side supports, and one or more support elements removably attached (i.e., non-permanently mounted) to one or more of those support plates. The side supports and the support element(s) include blade slots into which the edges of blades can be inserted during blade installation in the chassis. Therefore, the position(s) of the support elements determine the blade heights that can be installed into the rackmount chassis. Because the support elements are removably attached to the support plates, the specific blade heights that can be accommodated by the rackmount chassis can be adjusted without removing the chassis from the rack in which it is mounted.

In one embodiment, each support element can be removably attached to a support plate via a rail on the support element that mates with a mounting channel on the support plate. A locking mechanism (e.g., a screw or spring-mounted plunger) can optionally be used to maintain the position of the support element relative to the support plate to prevent inadvertent movement of the support element during blade installation/removal. Alternatively, various other attachment mechanisms (e.g., tabs, clamps, clips, hooks, and latches, among others) can be used to removably attach support elements to support plates.

Any number of support elements can be mounted on a single support plate, depending on the specific blade heights to be accommodated. Furthermore, different support plates in a single chassis may include different numbers of support elements to enable the formation of a single rackmount component that incorporates blades having a variety of heights.

The invention will be more fully understood in view of the following description and drawings.

DETAILED DESCRIPTION

Conventional rackmount chassis designs impose fixed size requirements on blades installed into those chassis designs. Specifically, once a conventional rackmount chassis is configured to accept blades of a particular height, reconfiguring that chassis to accept blades of a different height is not possible without removal of the entire chassis from the rackmount system in which it is mounted. By incorporating support plates that run the length of the chassis and removable support rails that are installed onto those supports spans, a rackmount chassis be provided that allows in-situ reconfiguration (i.e., reconfiguration without removal of the chassis from the rack in which it is installed) to accommodate blades of different heights.

Figure 3A:
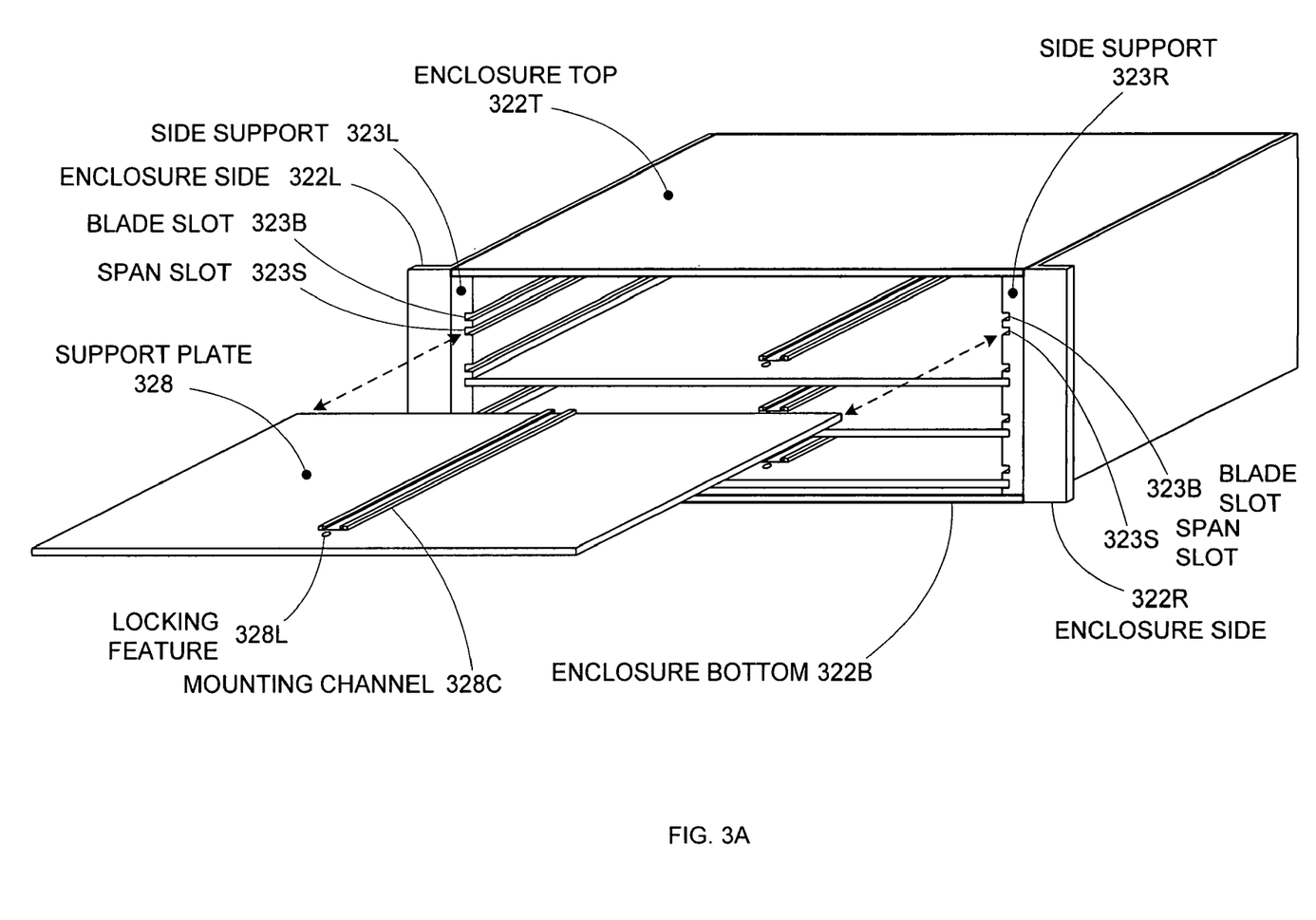
FIGS. 3A and 3B are isometric diagrams of a rackmount chassis that includes removable supports to accommodate blades having a variety of heights.
Figure 3B:
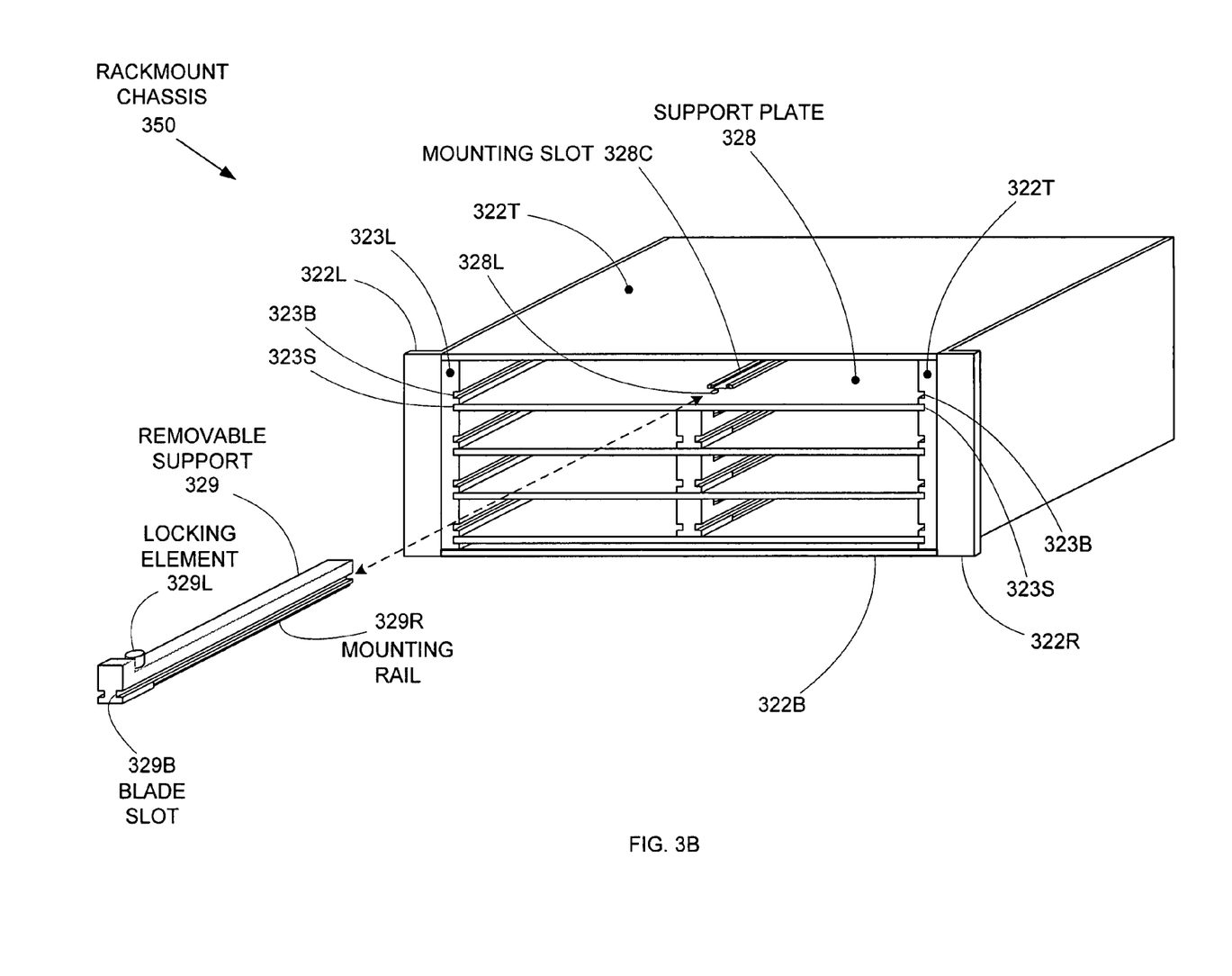

FIGS. 3A and 3B show isometric assembly views of a rackmount chassis 350 that incorporates removable support rails to enable in-situ reconfiguration. In FIG. 3A, the initial assembly of rackmount chassis 350 is depicted. Rackmount chassis 350 includes rectangular parallel enclosure sides 322L and 322R joined by a rectangular parallel enclosure top 322T and enclosure bottom 322B to form exterior surfaces (essentially defining a hollow right rectangular prism) of rackmount chassis 350 (optional rear and front covers are not shown for clarity but can also be included to allow rackmount chassis 250 to completely enclose the interior components). Side supports 323L and 323R are mounted between enclosure top 322T and enclosure bottom 322B adjacent to enclosure sides 322L and 322R, respectively. Note that while side supports 323L and 323R are depicted as being positioned against enclosure sides 322L and 322R, respectively, for exemplary purposes, in various other embodiments, side supports 323L and/or 323R can be positioned a slight distance away from enclosure sides 322L and/or 322R, respectively (e.g., to allow cooling fans to be installed between side support 323R and enclosure side 322R). However, note further that it is generally desirable to space side supports 323L and 323R as widely as possible within the bounds defined by enclosure sides 322L and 322R to maximize the allowable blade installation area.

Side supports 323L and 323R include multiple span slots 323S and multiple blade slots 323B (blade slots 323B are sized to accept the mounting edges of rackmount blades). Each span slot 323S in side support 323L is aligned with a corresponding span slot 323S in side support 323R (i.e., the support surfaces of the corresponding slots 323S lie in a common plane at the same (perpendicular) distance from enclosure bottom 322B). Thus, each of these pairs of span slots 323S provides a mounting location for a planar rectangular support plate 328 that spans the distance between side supports 323L and 323R. In this embodiment, a plurality of (e.g., four) parallel support plates 328 may be supported in rackmount chassis 350 by and between side supports 323R and 323L. Note that while discrete side supports 323R and 323L are depicted and described for exemplary purposes, in various other embodiments, side supports 323R and 323L (and in particular, any blade slots 323B and span slots 323S) may be integrated into enclosure sides 322R and 322L, respectively.

The slot-based mounting mechanism for support plates 328 beneficially allows any or all of support plates 328 to be replaced without removing rackmount chassis 350 from its installed location. However, note that while a slot-based mounting mechanism is depicted and described for exemplary purposes, according to various other embodiments any other type of interface can be used to position/secure support plates 328 (e.g., tabs, hardware such as rivets or screws, and/or adhesives, among others).

Each support plate 328 includes a mounting channel 328C and optionally, a locking feature 328L. Each mounting channel 328C can be formed using a variety of techniques, including forming the mounting channel 328C from the material of the support plate 328 or attaching channel parts to support plate 328, among others. As shown in FIG. 3B, a removable support 329 can be installed at each mounting channel 328C on each support plate 328. In this embodiment, each removable support 329 includes a mounting rail 329R that mates with any mounting channel 328C, thereby allowing each removable support 329 to be installed, removed, or replaced as desired by sliding its mounting rail 329R into/out of the associated mounting channel 328C, without the necessity of removing rackmount chassis 350 from its installed location. Note that in various embodiments, support plates 328 themselves may be also be removable/replaceable without the necessity of removing rackmount chassis 350 from its installed location.

Note that while removable supports 329 are depicted and described as being supported from the bottom by support plates 328 for exemplary purposes, in various other embodiments, removable supports 329 could "hang" below support plates 328. Note further that while a rail-based mounting system for removable supports 329 is depicted and described for exemplary purposes, any mounting mechanism (e.g., tabs, clamps, hooks, clips, latches, or any other mechanism that allows for "on-demand" attachment and removal) can be used to removably attach removable supports 329 to support plate 328. Note further that while a single mounting channel 328C is shown on each support plate 328 for exemplary purposes, in various other embodiment, each support plate 328 can include any number of mounting slots 328S (or other features for attaching removable supports 329).

Each removable support 329 can optionally include a locking element 329L (e.g., a screw, spring-loaded plunger, or any other locking mechanism) for securing the removable support 329 to the support plate 328. The locking element 329L engages or otherwise interfaces with the locking feature 328L of the support plate 328 in which the removable support 329 is installed to prevent inadvertent displacement of that removable support during subsequent blade installations/removals.

Note that each removable support 329 is depicted as having a reduced height above the mounting rail 329R of that removable support 329. This reduced height can improve airflow within rackmount chassis 350, improve usability (by providing a grip location at the thicker portion towards the front of removable support 329), and/or improve the manufacturability of removable support 329. However, in various other embodiments, removable support 329 may exhibit any other shape/configuration, including exhibiting a uniform height or exhibiting a pattern of cutouts or apertures (e.g., to provide airflow paths), among others. Note further that while the thicker portions of removable supports are depicted as substantially filling the gaps between support plates 328 for exemplary purposes, in various other embodiments, removable supports 329 may not span the full distance between adjacent support plates 328.

Figure 3C:
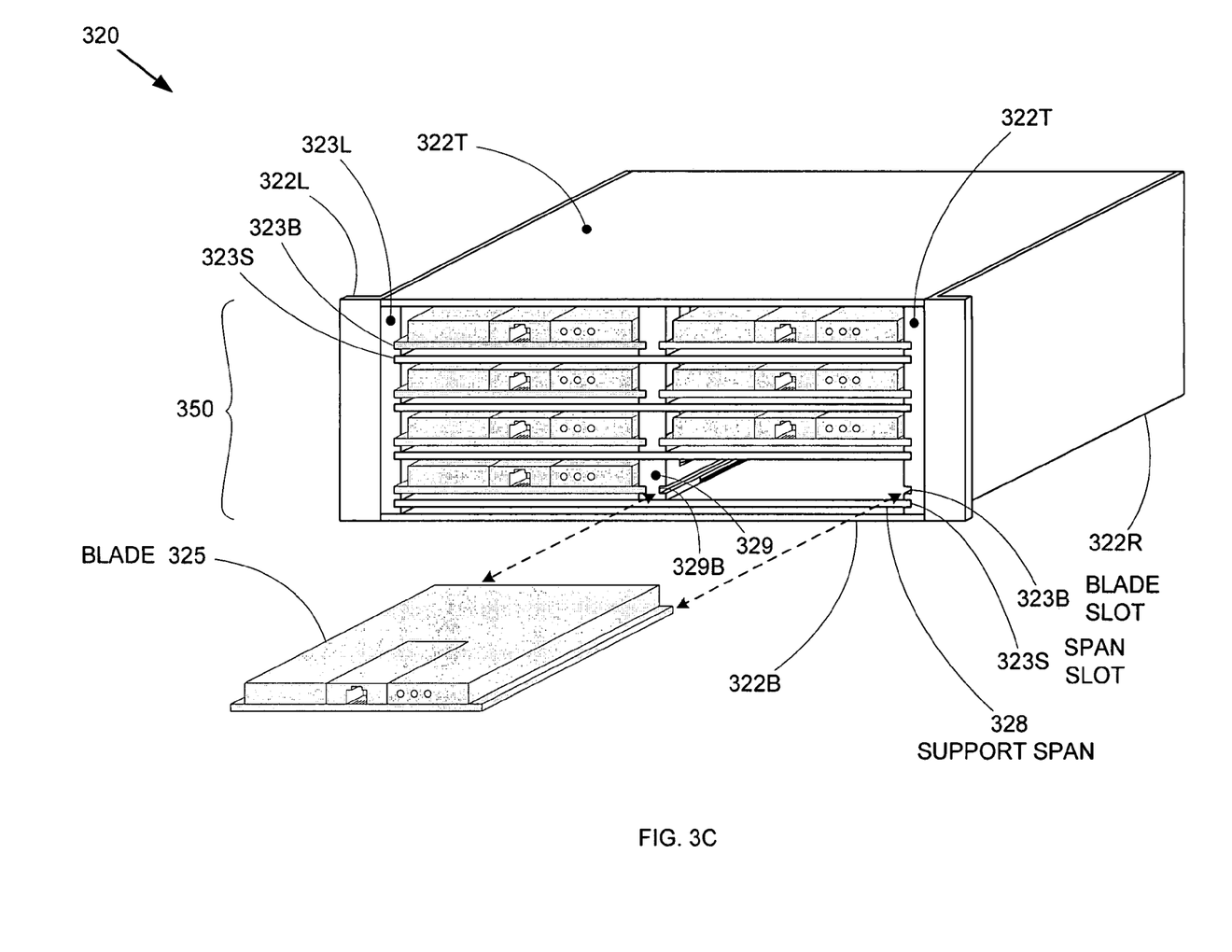
FIGS. 3C and 3D are isometric diagrams of rackmount components incorporating the rackmount chassis of FIGS. 3A and 3B.

Each removable support 329 further includes a set of blade slots 329B that are sized to accept the mounting edges of rackmount blades. Each blade slot 329B is aligned in a common plane with a corresponding blade slot 323B in one of side supports 323L or 323R. Therefore, each removable support 329 can support one blade 325 in conjunction with side support 323L and another blade 325 in conjunction with side support 323R, as shown in FIG. 3C. Note that while removable supports 329 are each depicted as including two blade slots 329B for exemplary purposes, according to various other embodiments, the set of blade slots 329B for a given removable support 329 can include any number of blade slots 329B (e.g., one, three, or four blade slots 329B).

FIG. 3C shows an isometric assembly view of a rackmount component 320 that includes rackmount chassis 350 (described with respect to FIGS. 3A and 3B) populated with blades 325. Each blade 325 is supported by a blade slot 329B in one of removable supports 329 and a corresponding blade slot 323B in one of side supports 323L or 323R. Because each removable support 329 is positioned halfway between side supports 323L and 323R, each of blades 325 can be considered to be a half-height blade. Furthermore, because four parallel support plates 328/removable supports 329 are present in chassis 350, four pairs of coplanar (i.e., substantially coplanar PCBs), laterally-adjacent blades 325 can be installed between side supports 323L and 323R.

In FIG. 3C, each of the eight half-height blades 325 is positioned parallel to and adjacent to at least one support plate 328. In particular, the uppermost and lowermost of the four blades 325 are positioned between and parallel to a support plate 328 and enclosure top 322T and enclosure bottom 322B, respectively. The two interior blades 325 are each between and parallel to a pair of support plates 328.

Because each removable support 329 can be removed (e.g., here by sliding) without disturbing any components other than the two blades being physically supported by that removable support 329, rackmount component 320 can be easily reconfigured as necessary without removal from the rack in which it is installed. For example, rackmount component 320 could be a network switch, with each of blades 325 being a fast Ethernet card (switch fabric (not shown for clarity) at the rear of rackmount component 320 could then provide signal routing to and from each fast Ethernet card).

To transition to gigabit Ethernet or fiber optic communications technologies, it may be necessary to replace some or all of the half-height fast Ethernet blades 325 with full-height gigabit Ethernet or fiber optic cards. Whereas a conventional rackmount component (e.g., rackmount component 220 shown in FIG. 2B) would have to be removed from the rack to be reconfigured from half-height to full-height blades, the removable supports 329 in rackmount chassis 350 enable in-situ reconfiguration of rackmount component 320.

Figure 3D:
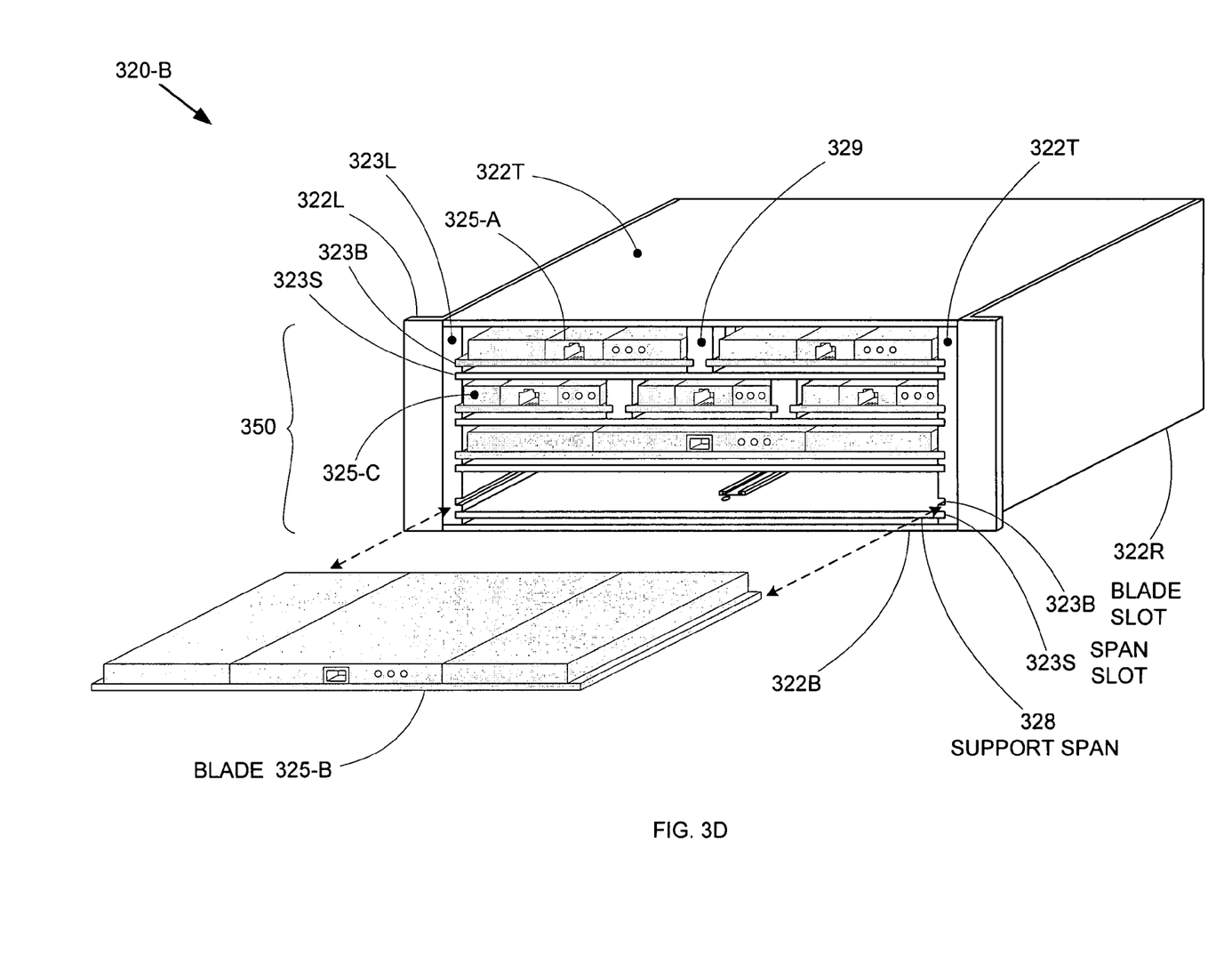

For example, FIG. 3D shows rackmount component 320 (labeled as 320-B to indicate the changed configuration from FIG. 3C) that includes two coplanar laterally-adjacent half-height blades 325, two full-height blades 325-B, and three coplanar laterally-adjacent third-height blades 325-C (e.g., two gigabit Ethernet cards (325), two fiber optic cards (325-B), and three fast Ethernet cards (325-C)). All of the blades 325, 325-B, and 325-C are parallel to each other within rackmount chassis 320B. Full-height blades 325-B are installed by removing removable supports 329 from the appropriate support plates 328 (in this case, the lower two support plates 328) and simply installing the full height blades into the blade slots 323B of side supports 323L and 323R. The three adjacent third-height blades 325-C are removably installed in of rackmount chassis 301 by mounting two removable supports 329 on a single support plate 328.

Note that conventional rackmount chassis designs (e.g., rackmount chassis 250 shown in FIG. 2A) can typically include only a single blade form factor (e.g., all half-height blades or all full-height blades). In contrast, the removable supports 329 in rackmount chassis 350 allow any combination of blade form factors to be installed in rackmount component 320. Note that a blade is generally defined as a PCB-mounted IC(s) that mates its own (electrical) edge connector, and not directly to another blade. Therefore, a daughterboard that couples directly to a blade would not itself be considered to be a blade.

Note further that removable supports 329 allow the configuration of rackmount component 320 to be changed in-situ, by simply installing/removing removable supports 329 based on the desired blade heights. This configuration flexibility can ensure a long service life for rackmount component 320, because future upgrades are not limited to a particular blade form factor.

Figure 4A:
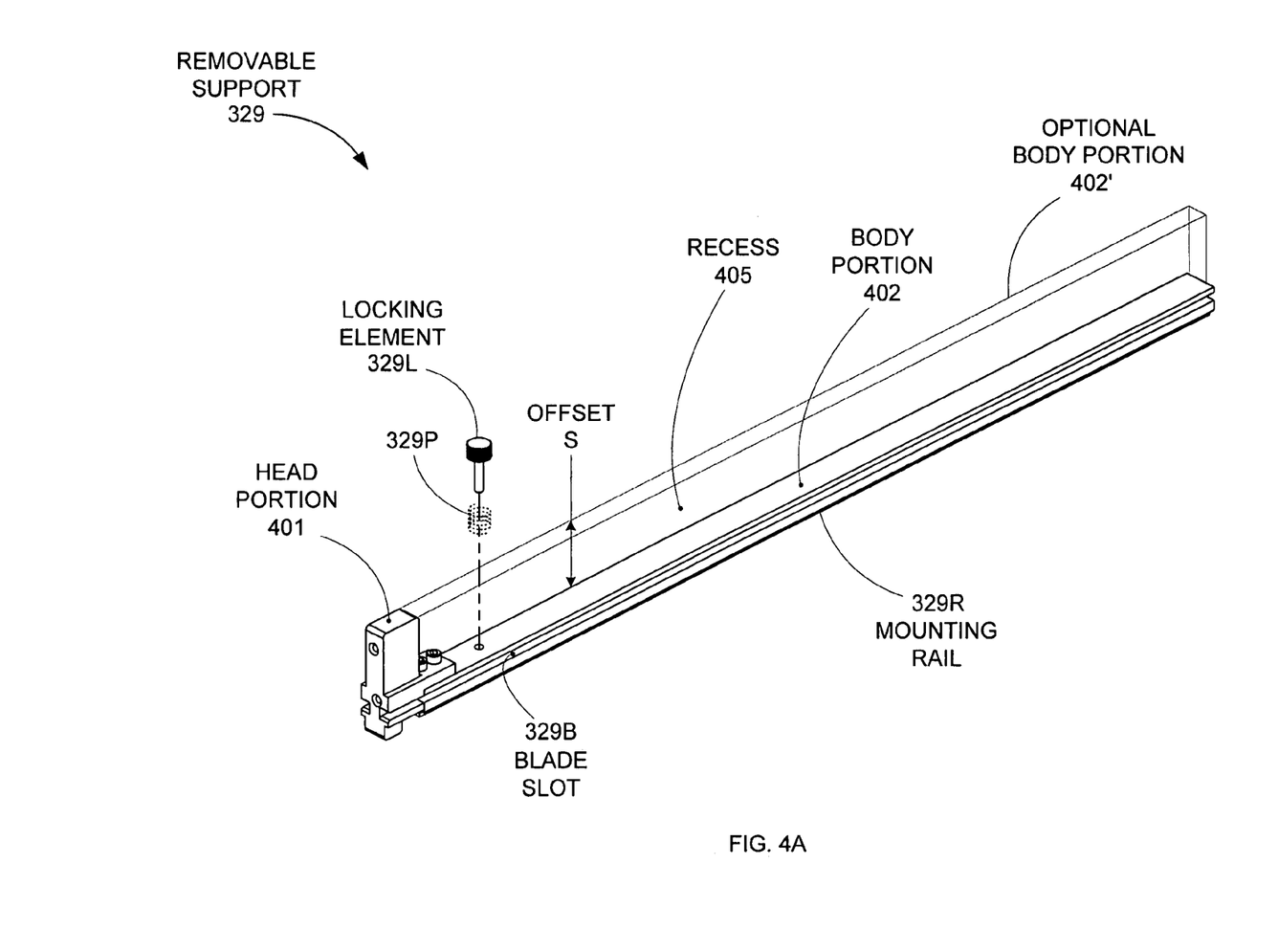
FIG. 4A is a detail view of an exemplary removable support as described with respect to FIG. 3B.

FIG. 4A is an exemplary detail view for removable support 329 (described with respect to FIG. 3B). Removable support 329 includes a head portion 401 affixed to a body portion 402. For exemplary purposes, head portion 401 is thicker than body portion 402 (as indicated by offset S), thereby effectively defining a recess 405 in the region above the (thinner) body portion 402. Head portion 401 can therefore provide a gripping location for removable support 329 to aid in installation/removal operations, while body portion 402 defines the greater portions of blade slots 329B and mounting rail 329R and provides recess 405 that minimizes blockage of cooling air flow when removable support 329 is installed in a rackmount chassis.

Note that although this two-piece construction can simplify the manufacturing requirements for removable support 329, in various other embodiments, removable support 329 can be formed as a single machined part or can be formed from a larger number of individual pieces. Note further that in various other embodiments, removable support 329 can exhibit a substantially constant overall thickness, as depicted by optional body portion 402' (indicated by the dotted lines). Because recess 405 would be substantially eliminated in such a configuration, optional body portion 402' can include cutouts, scallops, perforations, or any other types of airflow paths (not shown for clarity).

Also depicted in FIG. 4A is optional locking element 329L, that can be used to maintain the installed position of removable support 329 relative to the support plate in which it is installed. In the embodiment depicted in FIG. 4A, locking element 329L can comprise a screw or plunger, and an optional spring 329P can provide spring-loading and/or capture of locking element 329L to removable support 329. Note, however, that various other locking mechanisms can be incorporated into or used with removable support 329 (e.g., clamps, latches, and friction elements, among others).

Figure 4B:
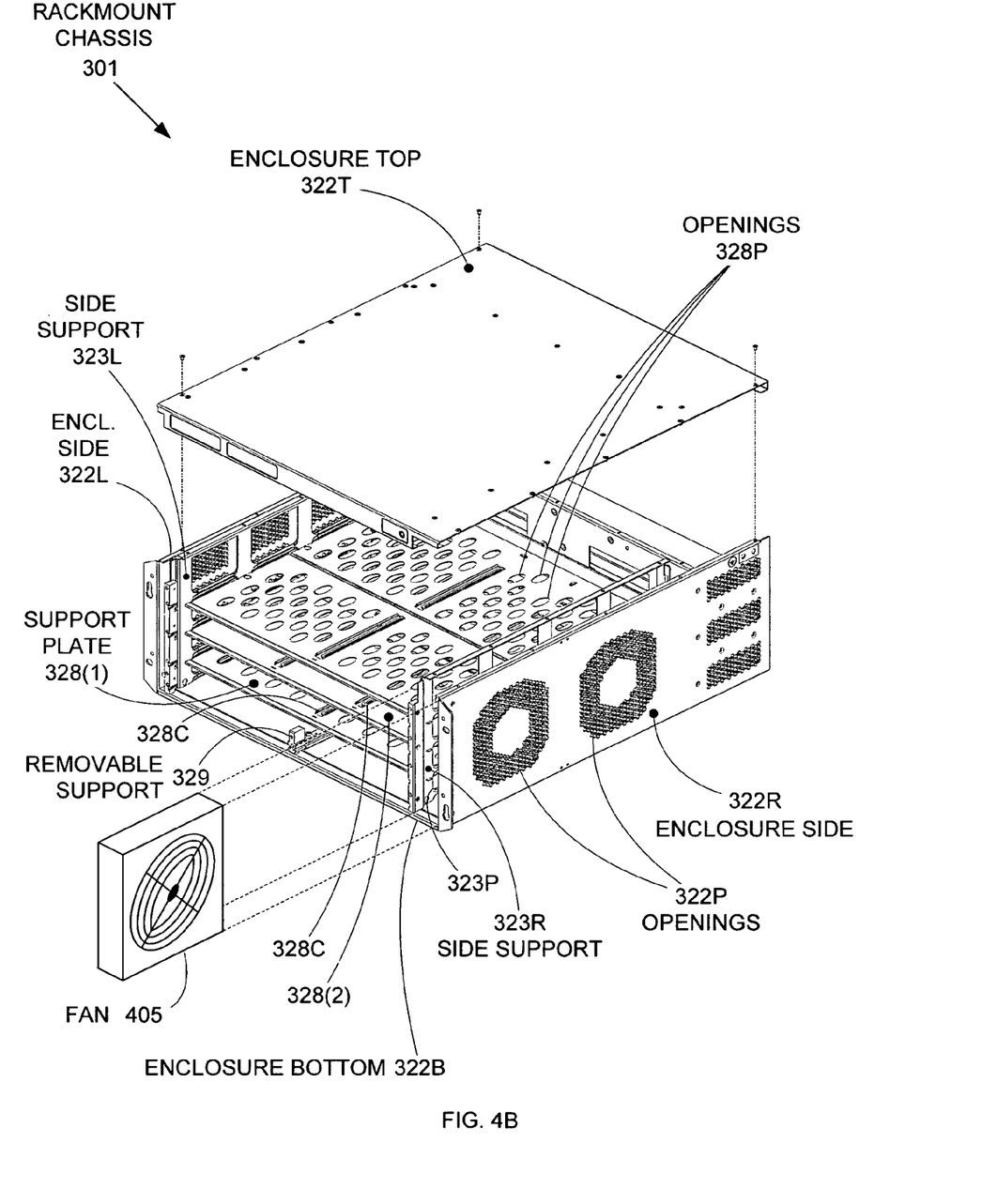
FIG. 4B is a detail view of an exemplary rackmount chassis as described with respect to FIGS. 3A and 3B.

FIG. 4B is an exemplary detail view for rackmount chassis 350 (described with respect to FIG. 3A). As shown in FIG. 4B, rackmount chassis 350 includes side supports 323L and 323R, support plates 328, and a removable support 329 assembled within an enclosure formed by enclosure top 322T, enclosure bottom 322B, and enclosure sides 322L and 322R. As depicted in FIG. 4B, in various embodiments, support plates 328 can include different patterns of openings 328P to provide cooling air paths for the blades that are to be mounted in the proximity of those support plates 328.

As further depicted in FIG. 4B, enclosure sides 322R and 322L can include openings 322P to provide cooling airflow paths and/or access to interior components. For example, one or more optional cooling fans 405 can be placed between side support 323R and enclosure side 322R, in which case openings 322P in enclosure side 322R and openings 323P in side support 323R can provide exhaust/intake paths for those cooling fans 405 (internal airflow paths can be provided by openings 328P in support plates 328 and/or cutouts/reduced height portions of removable supports 329).

In addition, as noted above with respect to FIG. 3A, a support plate 328 can include any number of mounting locations (e.g., mounting channels 328C) for removable supports 329. For example, support plate 328(1) includes a single mounting channel 328C, while support plate 328(2) includes two mounting channels 328C, thereby providing installation options for both half-height and third-height blades.

In this manner, a rackmount chassis and component assembly is provided that enables in-situ blade reconfiguration.

Practitioners will appreciate that any chassis product that includes one or more slots for insertion of a blade (or blades) that span a dimension (height or width) of a chassis body could utilize the concepts described herein so that a plurality of co-planar blades could be installed in a single slot. For instance, instead of a rackmount chassis, support plates and removable supports similar to those described herein could be installed in a free standing server chassis or a personal computer chassis. Further, although the rackmount chassis may house, for instance, a switch or router, which are special purpose computers, the rackmount or other chassis may house, for instance, a general purpose computer or some other type of electronic device.

Although the present invention has been described in connection with several embodiments, it is understood that this invention is not limited to the embodiments disclosed, but is capable of various modifications that would be apparent to one of ordinary skill in the art. Thus, the invention is limited only by the following claims and their equivalents.

The invention claimed is:

1. An electronic component comprising:
    a first support comprising a first set of blade slots;
    a second support comprising a second set of blade slots;
    a first support plate supported by the first support and the second support; and
    a first support element removably attached to the first support plate, the first support element comprising a third set of blade slots, wherein a first one of the third set of blade slots is aligned with a first one of the first set of blade slots.

2. The electronic component of claim 1, wherein the electronic component comprises a rackmount component.

3. The electronic component of claim 1, further comprising a first blade,
    wherein a first mounting edge of the first blade is inserted into the first one of the first set of blade slots, and
    wherein a second mounting edge of the first blade is inserted into the first one of the third set of blade slots.

4. The electronic component of claim 3, wherein a second one of the third set of blade slots is aligned with a first one of the second set of blade slots,
    wherein the electronic component further comprises a second blade,
    wherein a first mounting edge of the second blade is inserted into the second one of the third set of blade slots, and
    wherein a second mounting edge of the second blade is inserted into the first one of the second set of blade slots.

5. The electronic component of claim 3, further comprising:
    a second support plate supported by the first support and the second support, the second support plate being parallel to the first support plate;
    a second support element removably attached to the second support plate, the second support element comprising a fourth set of blade slots, wherein a first one of the fourth set of blade slots is aligned with a second one of the first set of blade slots; and
    a second blade, wherein a first mounting edge of the second blade is inserted into the second one of the first set of blade slots, and wherein a second mounting edge of the second blade is inserted into the first one of the fourth set of blade slots.

6. The electronic component of claim 3, further comprising:
    a second support element removably attached to the first support plate, wherein the second support element comprises a fourth set of blade slots, wherein a first one of the fourth set of blade slots is aligned with a first one of the second set of blade slots; and
    a second blade, wherein a first mounting edge of the second blade is inserted into the first one of the fourth set of blade slots, and wherein a second mounting edge of the second blade is inserted into the first one of the second set of blade slots.

7. The electronic component of claim 3, further comprising:
    a second support element removably attached to the first support plate, wherein the second support element comprises a fourth set of blade slots, and wherein a first one of the fourth set of blade slots is aligned with a second one of the third set of blade slots; and
    a second blade, wherein a first mounting edge of the second blade is inserted into the second one of the third set of blade slots, and wherein a second mounting edge of the second blade is inserted into the first one of the fourth set of blade slots.

8. The electronic component of claim 3, wherein a second one of the first set of blade slots is aligned with a first one of the second set of blade slots, wherein the electronic component further comprises a second blade,
wherein a first mounting edge of the second blade is inserted into the second one of the first set of blade slots, and
wherein a second mounting edge of the second blade is inserted into the first one of the second set of blade slots.

9. The electronic component of claim 3, further comprising a fan adjacent to the first support, wherein the first support includes a set of openings to allow the fan to move air across the first blade.

10. The electronic component of claim 1, wherein the first support plate includes a mounting channel,
wherein the first support element further comprises a mounting rail, and
wherein the first support element is removably attached to the first support plate by inserting the mounting rail into the mounting channel.

11. The electronic component of claim 10, further comprising a locking mechanism for maintaining a position of the mounting rail in the mounting channel.

12. The electronic component of claim 1, wherein the first support further comprises a first set of support slots,
wherein the second support further comprises a second set of support slots, and
wherein the first support plate is installed in one of the first set of support slots and one of the second set of support slots.

13. An electronic device comprising:
parallel coplanar first and second blades each removably supported within a chassis;
a plate supported within the chassis parallel to the first and second blades, wherein the plate substantially spans a width of the chassis;
a first blade support removably coupled to a first interior portion of the plate, wherein juxtaposed mounting edges of the first and second blades are removably engaged with the blade support.

14. The electronic device of claim 13, further comprising a third blade parallel to the first and second blades and the plate,
wherein a mounting edge-to-mounting edge dimension of the third blade is different from a mounting edge-to-mounting edge dimension of the first blade and a mounting edge-to-mounting edge dimension of the second blade.

15. The electronic device of claim 13, further comprising:
a third blade removably supported within the chassis, the third blade being coplanar with the first and second blades; and
a second blade support coupled to a second interior portion of the plate, wherein juxtaposed mounting edges of the second and third blades are removably engaged with the second blade support.

16. The electronic device of claim 13, wherein the plate is removably engaged with the chassis.

17. The electronic device of claim 13, further comprising a fan,
wherein the first blade support includes at least one aperture to allow airflow from the fan to pass over the first and second blades.

18. The electronic component of claim 1, wherein the first support element is removably attached to the first support plate at a location between the first support and the second support.

* * * * *